(12) United States Patent
Niaz

(10) Patent No.: US 9,702,288 B2
(45) Date of Patent: Jul. 11, 2017

(54) EMISSIONS CLEANING MODULE

(71) Applicant: Perkins Engines Company Limited, Cambridgeshire (GB)

(72) Inventor: Naseer A. Niaz, Cambridgeshire (GB)

(73) Assignee: Perkins Engines Company Limited, Peterborough (GB)

( * ) Notice: Subject to any disclaimer, the term of this patent is extended or adjusted under 35 U.S.C. 154(b) by 0 days.

(21) Appl. No.: 14/391,599

(22) PCT Filed: Dec. 7, 2012

(86) PCT No.: PCT/GB2012/053063
§ 371 (c)(1),
(2) Date: Oct. 9, 2014

(87) PCT Pub. No.: WO2013/160635
PCT Pub. Date: Oct. 31, 2013

(65) Prior Publication Data
US 2015/0064072 A1    Mar. 5, 2015

(30) Foreign Application Priority Data

Apr. 24, 2012 (GB) .................................. 1207201.3

(51) Int. Cl.
*F01N 3/28* (2006.01)
*F01N 3/20* (2006.01)
(Continued)

(52) U.S. Cl.
CPC ........... *F01N 3/20* (2013.01); *B01D 46/0002* (2013.01); *B01D 46/0057* (2013.01);
(Continued)

(58) Field of Classification Search
None
See application file for complete search history.

(56) References Cited

U.S. PATENT DOCUMENTS

| | | | |
|---|---|---|---|
| 4,747,624 A | 5/1988 | Faber et al. | |
| 5,331,810 A | 7/1994 | Ingermann et al. | |

(Continued)

FOREIGN PATENT DOCUMENTS

| | | |
|---|---|---|
| CN | 101874152 | 12/2012 |
| EP | 0722040 A2 | 7/1996 |
| FR | 2876147 A1 | 4/2006 |

OTHER PUBLICATIONS

European Patent Office, International Search Report in International Patent Application No. PCT/GB2012/053063, Mar. 26, 2013, 4 pp.

*Primary Examiner* — Walter D Griffin
*Assistant Examiner* — Jelitza Perez

(57) ABSTRACT

An emissions cleaning module is provided including a first support, a second support and a mixer module. The mixer module extends between the first support and the second support. The mixer module includes an outer body and an inner body located within the outer body. In addition the outer body is fixedly retained to the first support and the second support. Further, a first end of the inner body is slidingly retained within the outer body, and a second end of the inner body is fixedly retained relative to the outer body at or near the second support.

17 Claims, 4 Drawing Sheets

(51) Int. Cl.

| | | |
|---|---|---|
| *F01N 13/08* | (2010.01) | |
| *F01N 13/00* | (2010.01) | |
| *F01N 13/14* | (2010.01) | |
| *F01N 13/18* | (2010.01) | |
| *F01N 3/021* | (2006.01) | |
| *F01N 3/02* | (2006.01) | |
| *F01N 3/023* | (2006.01) | |
| *G01M 15/10* | (2006.01) | |
| *B60R 13/08* | (2006.01) | |
| *B01D 46/00* | (2006.01) | |
| *F01N 3/08* | (2006.01) | |
| *B01D 53/86* | (2006.01) | |
| *F01N 3/035* | (2006.01) | |
| *B01D 53/92* | (2006.01) | |
| *F01N 9/00* | (2006.01) | |
| *H05K 5/02* | (2006.01) | |
| *H05K 7/20* | (2006.01) | |
| *B01F 5/06* | (2006.01) | |
| *F01N 1/08* | (2006.01) | |

(52) U.S. Cl.
CPC .......... *B01D 53/864* (2013.01); *B01D 53/92* (2013.01); *B60R 13/0876* (2013.01); *F01N 3/02* (2013.01); *F01N 3/021* (2013.01); *F01N 3/0233* (2013.01); *F01N 3/035* (2013.01); *F01N 3/08* (2013.01); *F01N 3/28* (2013.01); *F01N 3/2892* (2013.01); *F01N 9/00* (2013.01); *F01N 13/00* (2013.01); *F01N 13/008* (2013.01); *F01N 13/08* (2013.01); *F01N 13/14* (2013.01); *F01N 13/143* (2013.01); *F01N 13/18* (2013.01); *F01N 13/1805* (2013.01); *G01M 15/102* (2013.01); *H05K 5/02* (2013.01); *H05K 7/20436* (2013.01); *B01F 5/0613* (2013.01); *B01F 2005/0621* (2013.01); *B01F 2005/0636* (2013.01); *F01N 1/086* (2013.01); *F01N 2240/20* (2013.01); *F01N 2260/022* (2013.01); *F01N 2260/20* (2013.01); *F01N 2450/22* (2013.01); *F01N 2470/04* (2013.01); *F01N 2490/06* (2013.01); *F01N 2610/1453* (2013.01); *Y10T 29/49345* (2015.01)

(56) References Cited

U.S. PATENT DOCUMENTS

| | | | |
|---|---|---|---|
| 2010/0132348 A1* | 6/2010 | Kowada | B01D 53/9431 60/324 |
| 2010/0257850 A1 | 10/2010 | Kowada et al. | |
| 2010/0300080 A1* | 12/2010 | Peters | F01N 3/2066 60/297 |
| 2011/0079003 A1* | 4/2011 | Sun | F01N 3/2066 60/310 |

* cited by examiner

EMISSIONS CLEANING MODULE

TECHNICAL FIELD

The disclosure relates to an apparatus for cleaning fluids emitted during the operation of combustion engines.

BACKGROUND

Engines, for example IC engines burning gasoline, diesel or biofuel, output various harmful substances which must be treated to meet current and future emissions legislation. Most commonly those substances comprise hydrocarbons (HC), carbon monoxides (CO), mono-nitrogen oxides ($NO_x$) and particulate matter, such as carbon (C), a constituent of soot. Some of those substances may be reduced by careful control of the operating conditions of the engine, but usually it is necessary to provide an emissions cleaning module downstream of the engine to treat at least some of those substances entrained in the exhaust gas. Various apparatus for reducing and/or eliminating constituents in emissions are known. For example, it is known to provide an oxidation device, such as a diesel oxidation catalyst, to reduce or to eliminate hydrocarbons (HC) and/or carbon monoxide (CO). Oxidation devices generally include a catalyst to convert those substances into carbon dioxide and water, which are significantly less harmful. As a further example, emissions cleaning modules may include a particulate filter to restrict the particulates present in the exhaust gas from being output to atmosphere.

By use of an emissions cleaning module, engine emissions can be cleaned, meaning that a proportion of the harmful substances which would otherwise be released to atmosphere are instead converted to carbon dioxide ($CO_2$), nitrogen ($N_2$) and water ($H_2O$).

In addition, it is known to reduce or eliminate mono-nitrogen oxides ($NO_x$) in diesel combustion emissions by conversion to diatomic nitrogen ($N_2$) and water ($H_2O$) by catalytic reaction with chemicals such as ammonia ($NH_3$) entrained in the exhaust gas. Generally ammonia is not present in exhaust gas and must therefore be introduced upstream of a catalyst, typically by injecting a urea solution into the exhaust gas which decomposes into ammonia at sufficiently high temperatures.

By these methods, engine emissions can be cleaned, meaning that a proportion of the harmful substances which would otherwise be released to atmosphere are instead converted to carbon dioxide ($CO_2$), nitrogen ($N_2$) and water ($H_2O$).

Emissions cleaning modules may also comprise an injector module for injecting a fluid, such as urea, into the engine emissions flow. It is also know to include a mixer module to aid mixer of the injected urea with the engine emissions flow. For example, US2010/0257850 describes an emission cleaning module having a mixer pipe. The mixer pipe is comprised of inner and outer pipes which are overlapped with each other in a relatively stretchable and retractable manner. The inner pipe is fixed at a right-hand end to a housing and the outer pipe is secured to an outer periphery of the inner pipe part-way along its length. A sliding seal is provided at an opposite end of the inner pipe. The structure of the mixer module of US2010/0257850 is relatively complicated.

Against this background there is provided an emissions cleaning module comprising an improved arrangement of mixer module.

SUMMARY OF THE DISCLOSURE

The present disclosure provides an emissions cleaning module comprising:
a first support;
a second support; and
a mixer module extending between the first support and the second support;
wherein the mixer module comprises:
an outer body; and
an inner body located within the outer body;
wherein:
the outer body is fixedly retained to the first support and the second support;
a first end of the inner body is slidingly retained within the outer body; and
a second end of the inner body is fixedly retained relative to the outer body at or near the second support.

BRIEF DESCRIPTION OF THE DRAWINGS

The present disclosure will now be described, by way of example only, with reference to the accompanying drawings in which.

DETAILED DESCRIPTION

Figure 1:
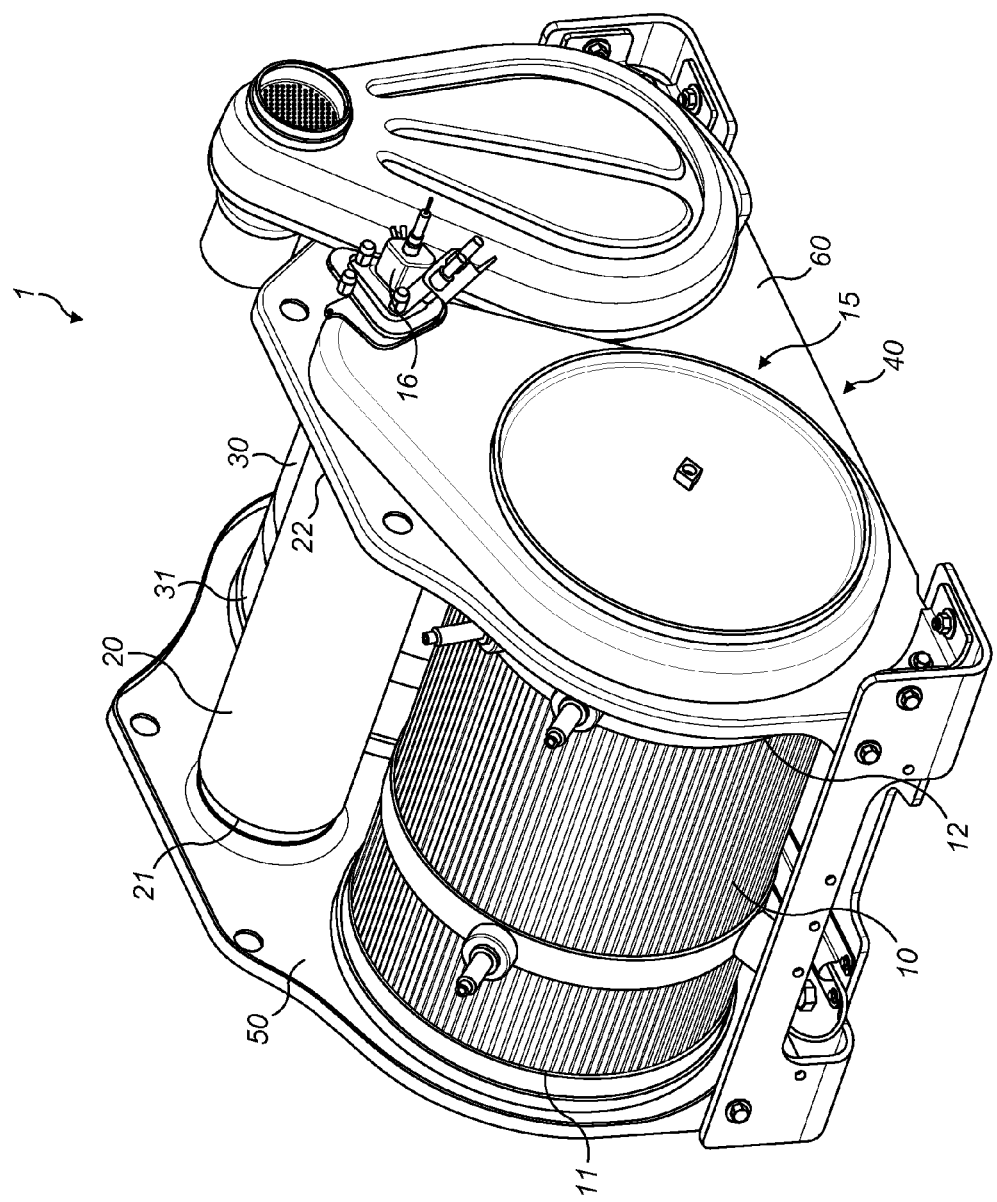
FIG. 1 shows an emissions cleaning module in accordance with the present disclosure.

An emissions cleaning module 1 is illustrated in FIG. 1.

The emissions cleaning module 1 may comprise a first conduit 10 and a second conduit 20. A third conduit 30 and a support structure 40 may also be present. The support structure 40 comprises a first support member 50 and a second support member 60.

Each support member 50, 60 may be generally planar and may be of rigid material, for example metal.

The first, second and third conduits 10, 20, 30 may be elongate, having an axis of elongation, and may have substantially constant cross-section along the axis of elongation. The first, second and third conduits 10, 20, 30 may be substantially cylindrical.

The first conduit 10 comprises a first end 11 providing an inlet to the conduit and a second end 12 providing an outlet to the conduit. The second conduit 20 comprises a first end 21 providing an outlet to the conduit and a second end 22 providing an inlet to the conduit. The third conduit 30 may comprise a first end 31 providing an inlet to the conduit and a second end providing an outlet to the conduit.

The conduits 10, 20, 30 may extend between the support members 50, 60. The conduits 10, 20, 30 may be generally substantially parallel. The first ends 11, 21, 31 of the first, second and third conduits 10, 20, 30 may be received in and may be shaped to correspond with first, second and third openings 51, 52, 53, respectively, of the first support member 50. The second ends 12, 22 of the first, second and third conduits 10, 20, 30 may be received in and may be shaped to correspond with first, second and third openings 61, 62, 63, respectively, of the second support member 60. By this arrangement, lateral movement of the conduits may be restricted.

Figure 2:
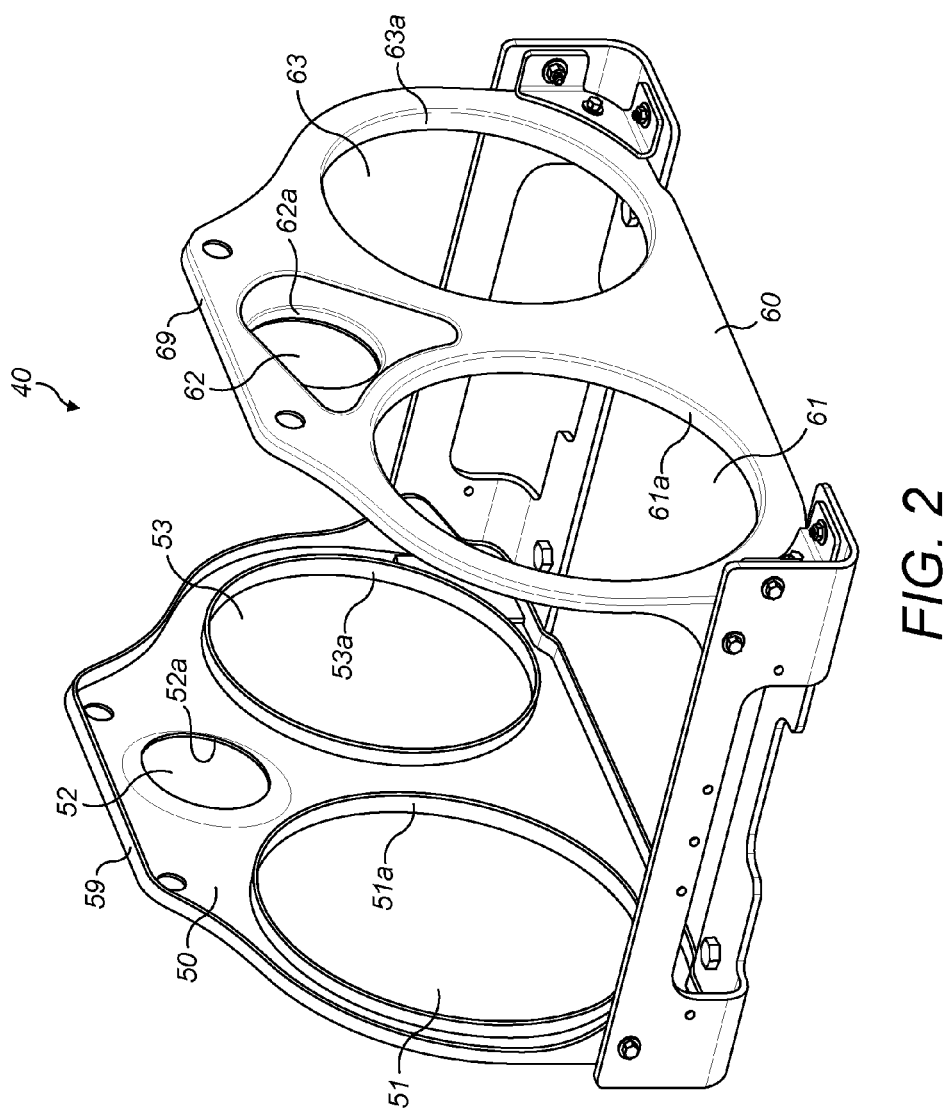
FIG. 2 shows a support frame of the emissions cleaning module of FIG. 1.

As shown in FIG. 2, each opening 51, 52, 53, 61, 62, 63 may comprise a flange 51a, 52a, 53a, 61a, 62a, 63a extending around a perimeter of the opening. Each support member 50, 60 may further comprise an inwardly turned lip 59, 69 extending at least part way around a periphery of the support member 50, 60.

The conduits 10, 20, 30 may all be of substantially similar length. The first conduit 10 may have a first diameter, the second conduit 20 may have a second diameter and the third conduit 30 may have a third diameter. The second diameter may be smaller than the first and third diameters.

The first and second ends 11, 21, 31, 12, 22 of the conduits 10, 20, 30 may be welded, adhered or otherwise secured to portions of the support members 50, 60 defining or surrounding the openings. Alternatively, first and second ends 11, 21, 31, 12, 22 of the conduits 10, 20, 30 may abut the inner sides of the support members 50, 60 so as to overlie respective openings in the support members 50, 60.

The first, second and third conduits 10, 20, 30 and the first and second support members 50, 60 may be interconnected in a manner which restricts relative translational movement of those components. Instead or in addition, the first, second and third conduits 10, 20, 30 and the first and second support members 50, 60 may be interconnected in a manner which restricts rotational movement of one component with respect to another.

The first conduit 10 is fluidly coupled to the second conduit 20 via a first end coupling 15 which fluidly connects the outlet of the first conduit 10 to the inlet of the second conduit 20. The first end coupling 15 may comprise an injector module 16. The second conduit 20 may be coupled to the third conduit 30 via a second end coupling 25 for fluidly connecting the outlet of the second conduit 20 to the inlet of the third conduit 30. Each of the first and second end couplings may define, in combination with its respective support member, a fluid flow path through which exhaust gas may pass between adjacent conduits.

Within the fluid flow path of the emissions cleaning module there may be located a diesel oxidation catalyst (DOC) module 71, a diesel particulate filter (DPF) module 70, an injector module 16, a mixer module 75, a selective catalyst reduction (SCR) module and an ammonia oxidation catalyst (AMOX) module.

The DOC module 71 may be located in a first portion of the first conduit 10 towards the first, inlet, end 11 of the first conduit 10. The DPF module 70 may be located in a second portion of the first conduit 10 towards the second, outlet, end 12 of the first conduit 10. The first end coupling 15 may provide a fluid flow path from the second end 12 of the first conduit 10 to the second end 22 of the second conduit 20. The first end coupling 15 may comprise the injector module 16.

The mixer module 75 may be located in, or formed by, the second conduit 20. The mixer module 75 may be configured to mix a fluid injected by the injector module 16 with a fluid arriving from the first conduit 10. The mixer module 75 may comprise multiple features, such as interspersed fins, which may give rise to an even blend of the injected fluid with the fluid from the first conduit 10. The second end coupling 25 may provide a fluid flow path from the first end 21 of the second conduit to the first end 31 of the third conduit 30.

Figure 3:
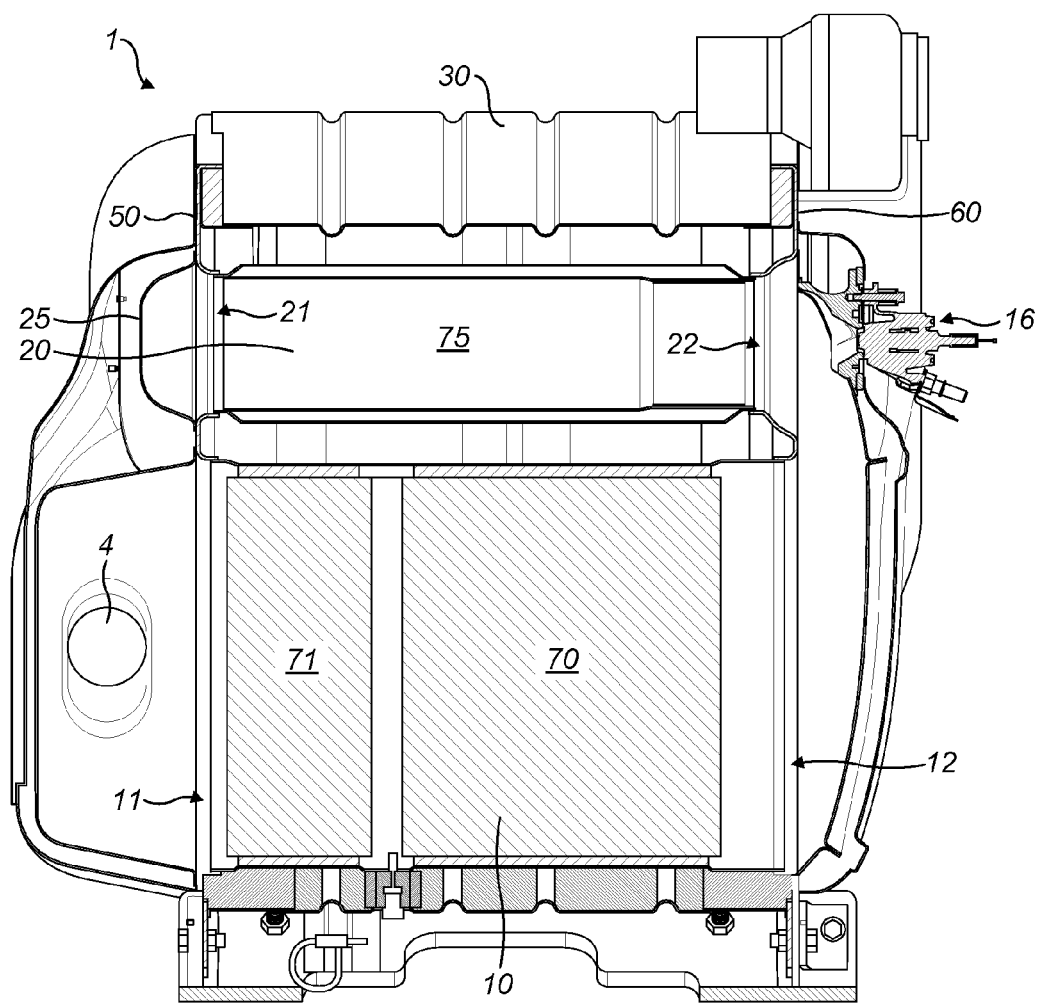
FIG. 3 shows a partial cross-section of the emissions cleaning module of FIG. 1.
Figure 4:
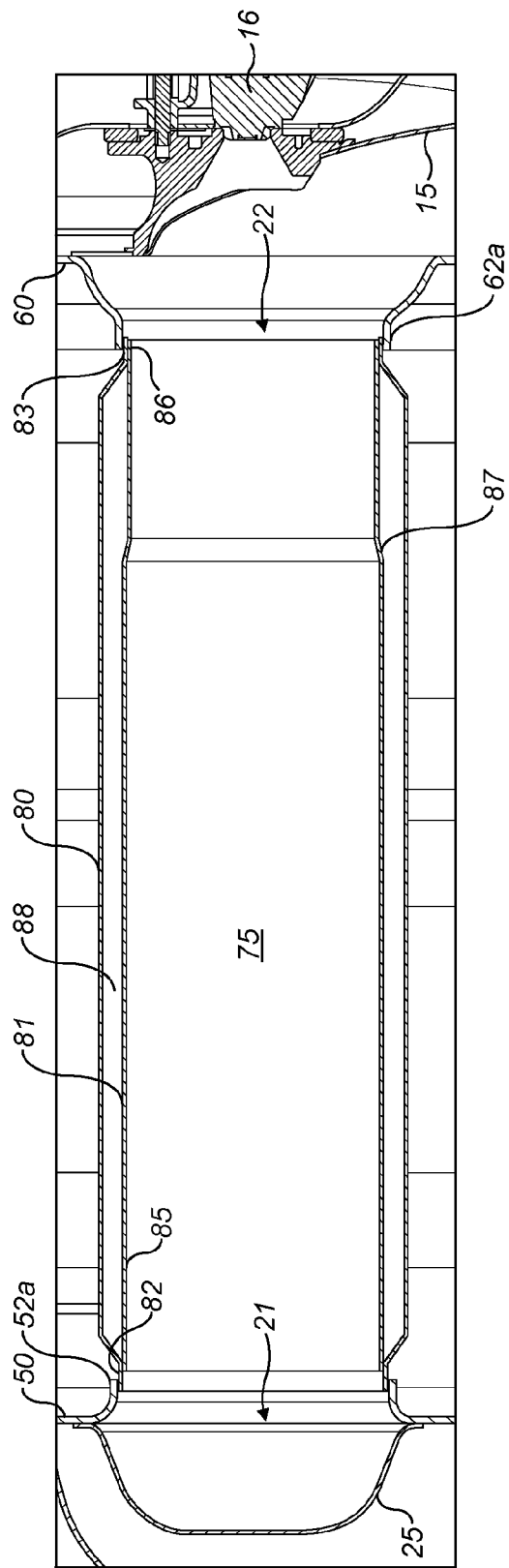
FIG. 4 shows a cross section of a mixer module of the emissions cleaning module of FIG. 1.

As shown in FIGS. 3 and 4, the mixer module 75 comprises an outer body 80 and an inner body 81 located within the outer body 80. The outer body 80 may form the external skin of the second conduit 20. An air gap 88 may be provided between the inner body 81 and the outer body 80.

The outer body 80 may be elongate and extends between the first support 50 and the second support 60. The outer body 80 may be cylindrical and may have a constant diameter at the ends therefore which may have a smaller diameter. A first end 82 of the outer body 80 is fixedly retained to the first support 50. The fixation may be by means of a weld between the first end 82 and the flange 52a. The connection may be to an inner or outer face of the flange 52a. A second end 83 of the outer body 80 is fixedly retained to the second support 60. The fixation may be by means of a weld between the second end 83 and the flange 62a. The connection may be to an inner or outer face of the flange 62a.

The inner body 81 may be elongate. The inner body 81 may be cylindrical and may have a constant diameter. Alternatively, as shown, it may have a tapered section 87 leading to one end having a smaller diameter than another. A first end 85 of the inner body 81 is slidingly retained within the outer body 82. The first end 85 of the inner body 81 may be slidingly retained in contact with the first end 82 of the outer body 80. The first end 85 of the inner body 81 may form a slidable interference fit within the first end 82 of the outer body 80. A second end 86 of the inner body 81 is fixedly retained relative to the outer body 80 at or near the second support 60. The fixation may be by means of a weld between the second end 86 and the outer body 80. Alternatively, the fixation may be by means of a weld between the second end 86 and the second support 60. Preferably, a single weld is used to join the second end 86 of the inner body 81, the second end 83 of the outer body 80 and the second support 60.

Thus, at the second end the inner body 81, outer body 80 and second support 60 may be prevented from moving axially relative to one another. However, at the first end the inner body 81 is free to move axially relative to the outer body 80.

The SCR module may be located in a first portion of the third conduit 30 towards the first end 31 of the third conduit 30. The SCR module may comprise a catalyst surface intended to catalyse a reaction to occur between the two fluids mixed in the mixer module and output by the diffuser. The AMOX module may both be located in a second portion of the third conduit 30 towards the second end of the third conduit 30. The AMOX module may comprise a catalyst which may catalyse a reaction of one or more of the products output from the SCR module.

In use, fluid may be supplied to the emissions cleaning module 1 via an inlet 4. Fluid may pass into the DOC module 71 in the first portion of the first conduit 10. Prior to receipt at the inlet 4, the pressure of the fluid may be controlled by a back pressure valve.

The DOC module 71 may comprise one or more catalysts, such as palladium or platinum. These materials serve as catalysts to cause oxidation of hydrocarbons ([HC]) and carbon monoxide (CO) present in the fluid flow in order to produce carbon dioxide ($CO_2$) and water ($H_2O$). The catalysts may be distributed in a manner so as to maximise the surface area of catalyst material in order to increase effectiveness of the catalyst in catalysing reactions.

Fluid may flow from the DOC module 71 to the DPF module 70 which comprises features which are intended to prevent onward passage of carbon (C) in the form of soot. Carbon particles in the fluid may thus trapped in the filter. The filter may be regenerated through known regeneration techniques. These techniques may involve controlling one or more of the temperature of the fluid, the pressure of the fluid and the proportion of unburnt fuel in the fluid.

Fluid may pass from the DOC module 70 past the injector module 16 located within the first end coupling 15. The injector module 16 may be associated with or attachable to a pump electronic tank unit (PETU). The pump electronic tank unit may comprise a tank for providing a reservoir for fluid to be injected by the injector. Such fluids may include urea or ammonia. The tank may comprise a lower portion having a first cross sectional area and an upper portion having a second cross sectional area. The second cross sectional area may be smaller than the first cross sectional area. The difference in cross sectional area between the first and second portions may provide for a volume to house additional components of the PETU. This may provide better protection than if components were simply attached to an otherwise external surface of the tank.

The PETU may further comprise a controller configured to control a volume of fluid to be injected from the tank by the injector. The controller may have as inputs, for example, temperature information and quantity of $NO_x$ information which may be derived from sensors in the SCR module.

Fluid may pass from the injector module 16 into the mixer module 75 located in the second conduit 20. The mixer module 75, as noted above, may comprise features for ensuring that the fluid originating from the first conduit 10 is well mixed with the fluid originating from the injector 16. Fluids flowing into the mixer module 75 may be hot causing thermal expansion of the inner body 81 of the second conduit 20. Any such expansion may be accommodated by relative sliding movement between the first end 85 of the inner body 81 and the first end 82 of the outer body 80. The relative movement may be constrained to be only or mainly a relative axial movement. The overlap between the inner body 81 and the outer body 80 at the first end 21 of the second conduit 20 may be sufficiently great to prevent opening of the air gap 88 during any expansion or contraction of the inner body 81.

Fluid may then pass via the second end coupling 25 into the SCR module located in the first portion of the third conduit via the second end coupling 25. The SCR module may comprise one or more catalysts through which the mixture of exhaust gas and urea/ammonia may flow. As the mixture passes over the surfaces of the catalyst a may reaction occur which converts the ammonia and $NO_x$ to diatomic nitrogen ($N_2$) and water ($H_2O$).

Fluid may pass from the SCR module to the AMOX module located in the second portion of the third conduit 30. The AMOX module may comprise an oxidation catalyst which may cause residual ammonia present in the fluid exiting the SCR module to react to produce nitrogen ($N_2$) and water ($H_2O$).

Fluid may pass from the AMOX module to the emissions cleaning module outlet located at the second end of the third conduit 30.

INDUSTRIAL APPLICABILITY

The present disclosure provides an emissions cleaning module comprising an improved arrangement of mixer module. In particular, the mixer module is well adapted to undergoing temperature changes and is provided with an improved method of attachment to a remainder of the emissions cleaning module.

The invention claimed is:

1. An emissions cleaning module for removing emissions from an exhaust gas, comprising:
   a first support;
   a second support, wherein the first support and the second support are generally planar and parallel to each other;
   a mixer module comprising a first end and a second end, the mixer module extending between the first support and the second support;
   wherein the mixer module comprises:
      a generally cylindrical outer body comprising a first end and a second end and having a generally constant diameter between the first and second ends;
      a generally cylindrical inner body comprising a first end and a second end, the inner body being located within the outer body, the outer body and inner body defining an air gap therebetween, the air gap extending generally along an entire length of the inner body, the outer body and the inner body being arranged concentrically between the first and the second support;
      the first end of the outer body is fixedly retained to the first support and the second support of the outer body is fixedly retained to the second support;
      the first end of the inner body is slidingly retained within the outer body to compensate for expansion and contraction of the inner body, an overlap between the first end of the inner body and the first end of the outer body prevents opening of the air gap during expansion and contraction of the inner body;
      the second end of the inner body is fixedly retained relative to the outer body at or near the second support;
   at least one fluid treatment module located upstream of the mixer module and comprising an end coupling fluidly connecting an output of the at least one fluid treatment module with an inlet of the mixer module, wherein the at least one fluid treatment module extends between the first support and the second support; and
   a urea injector module upstream of the mixer module and disposed on a fluid flow coupling, the fluid flow coupling being disposed on one of the first support and the second support and defining a portion of a path of the exhaust gas entering the inner body of the mixer module.

2. An emissions cleaning module as claimed in claim 1 wherein the second end of the inner body is fixedly retained to the outer body at or near the second support.

3. An emissions cleaning module as claimed in claim 1 wherein the second end of the inner body is fixedly retained to the second support.

4. An emissions cleaning module as claimed in claim 1 wherein the first end of the inner body is slidingly retained within the outer body at or near the first support.

5. An emissions cleaning module as claimed in claim 1 wherein the inner body extends along substantially a full length of the outer body.

6. An emissions cleaning module as claimed in claim 1 wherein the second end of the inner body is fixedly retained to the outer body at or near the second support by a weld joining the inner body, the outer body and the second support together.

7. An emissions cleaning module as claimed in claim 1 wherein the mixer module comprises:
   an inlet end proximal the second support; and
   an outlet end proximal the first support.

8. An emissions cleaning module as claimed in claim 7 wherein the inner body defines a conduit for conveying the exhaust gas from the inlet end to the outlet end.

9. An emissions cleaning module as claimed in claim 1 wherein the first end of the inner body forms a slidable interference fit with the outer body.

10. An emissions cleaning module as claimed in claim 1 wherein the first support and/or the second support comprise an upstanding flange defining a seat for the mixer module.

11. An emissions cleaning module as claimed in claim 10 wherein the upstanding flange of the first support and/or second support is inwardly directed.

12. An emissions cleaning module as claimed in claim 1 further comprising at least one mixer feature within the inner body.

13. An emissions cleaning module as claimed in claim 1 wherein the end coupling is coupled to at least one of the first support or the second support.

14. An emissions cleaning module as claimed in claim 2 wherein the second end of the inner body is fixedly retained to the second support.

15. An emissions cleaning module as claimed in claim 2 wherein the first end of the inner body is slidingly retained within the outer body at or near the first support.

16. An emissions cleaning module as claimed in claim 3 wherein the first end of the inner body is slidingly retained within the outer body at or near the first support.

17. An emissions cleaning module as claimed in claim 14 wherein the first end of the inner body is slidingly retained within the outer body at or near the first support.

* * * * *